United States Patent
Graessner

(10) Patent No.: US 7,532,009 B2
(45) Date of Patent: May 12, 2009

(54) METHOD AND MAGNETIC RESONANCE APPARATUS FOR MONITORING APPARATUS INTERACTION WITH MAGNETICALLY-ATTRACTED OBJECTS

(75) Inventor: Joachim Graessner, Bönningstedt (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/671,538

(22) Filed: Feb. 6, 2007

(65) Prior Publication Data
US 2007/0194790 A1    Aug. 23, 2007

(30) Foreign Application Priority Data
Feb. 6, 2006    (DE) ............... 10 2006 005 285

(51) Int. Cl.
*G01V 3/00* (2006.01)
(52) U.S. Cl. ............................................. 324/320
(58) Field of Classification Search ......... 324/300–322; 600/410–435
See application file for complete search history.

(56) References Cited

U.S. PATENT DOCUMENTS

| | | | |
|---|---|---|---|
| 4,684,889 A | | 8/1987 | Yamaguchi et al. |
| 4,990,850 A | * | 2/1991 | Votruba ...................... 324/225 |
| 5,012,217 A | | 4/1991 | Palkovich et al. |
| 5,424,643 A | * | 6/1995 | Morich et al. ............... 324/318 |
| 5,451,875 A | * | 9/1995 | Patrick et al. .............. 324/318 |
| 5,457,387 A | * | 10/1995 | Patrick et al. ............... 324/318 |
| 5,952,830 A | * | 9/1999 | Petropoulos et al. ......... 324/318 |
| 5,990,681 A | * | 11/1999 | Richard et al. .............. 324/318 |
| 6,487,436 B1 | * | 11/2002 | Boskamp et al. ............ 600/422 |
| 6,522,144 B2 | * | 2/2003 | Boskamp ..................... 324/318 |
| 6,590,392 B2 | * | 7/2003 | Boskamp et al. ............ 324/318 |
| 6,591,128 B1 | * | 7/2003 | Wu et al. .................... 600/422 |
| 6,593,744 B2 | * | 7/2003 | Burl et al. ................... 324/322 |
| 6,717,409 B2 | * | 4/2004 | Kimmlingen et al. ....... 324/318 |
| 6,954,068 B1 | * | 10/2005 | Takamori et al. ............ 324/318 |
| 6,995,561 B2 | * | 2/2006 | Boskamp et al. ............ 324/318 |
| 7,015,695 B2 | * | 3/2006 | Tropp et al. ................. 324/318 |
| 7,113,092 B2 | * | 9/2006 | Keene ......................... 340/551 |
| 7,239,134 B2 | * | 7/2007 | McClure et al. ............. 324/232 |
| 7,254,437 B2 | * | 8/2007 | Miyazaki .................... 600/410 |
| 7,276,906 B2 | * | 10/2007 | Shvartsman et al. ........ 324/318 |
| 7,305,845 B2 | * | 12/2007 | Mangano et al. ............. 62/276 |
| 7,327,137 B1 | * | 2/2008 | Crowley et al. ............. 324/300 |
| 7,385,549 B2 | * | 6/2008 | Lovberg et al. .............. 342/22 |
| 7,414,400 B2 | * | 8/2008 | Hoult .......................... 324/260 |
| 2006/0022670 A1 | | 2/2006 | Kumar et al. |

FOREIGN PATENT DOCUMENTS

EP    0 391 515    10/1990
JP    01223946 A  *  9/1989

* cited by examiner

*Primary Examiner*—Brij Shrivastav
*Assistant Examiner*—Dixomara Vargas
(74) *Attorney, Agent, or Firm*—Schiff Hardin LLP

(57) ABSTRACT

A magnetic resonance apparatus has a magnetic field generation device for generating a strong magnetic field, and at least one detection device for automatic detection of an object attracted onto or into the magnetic resonance apparatus due to interaction with the magnetic field.

10 Claims, 1 Drawing Sheet

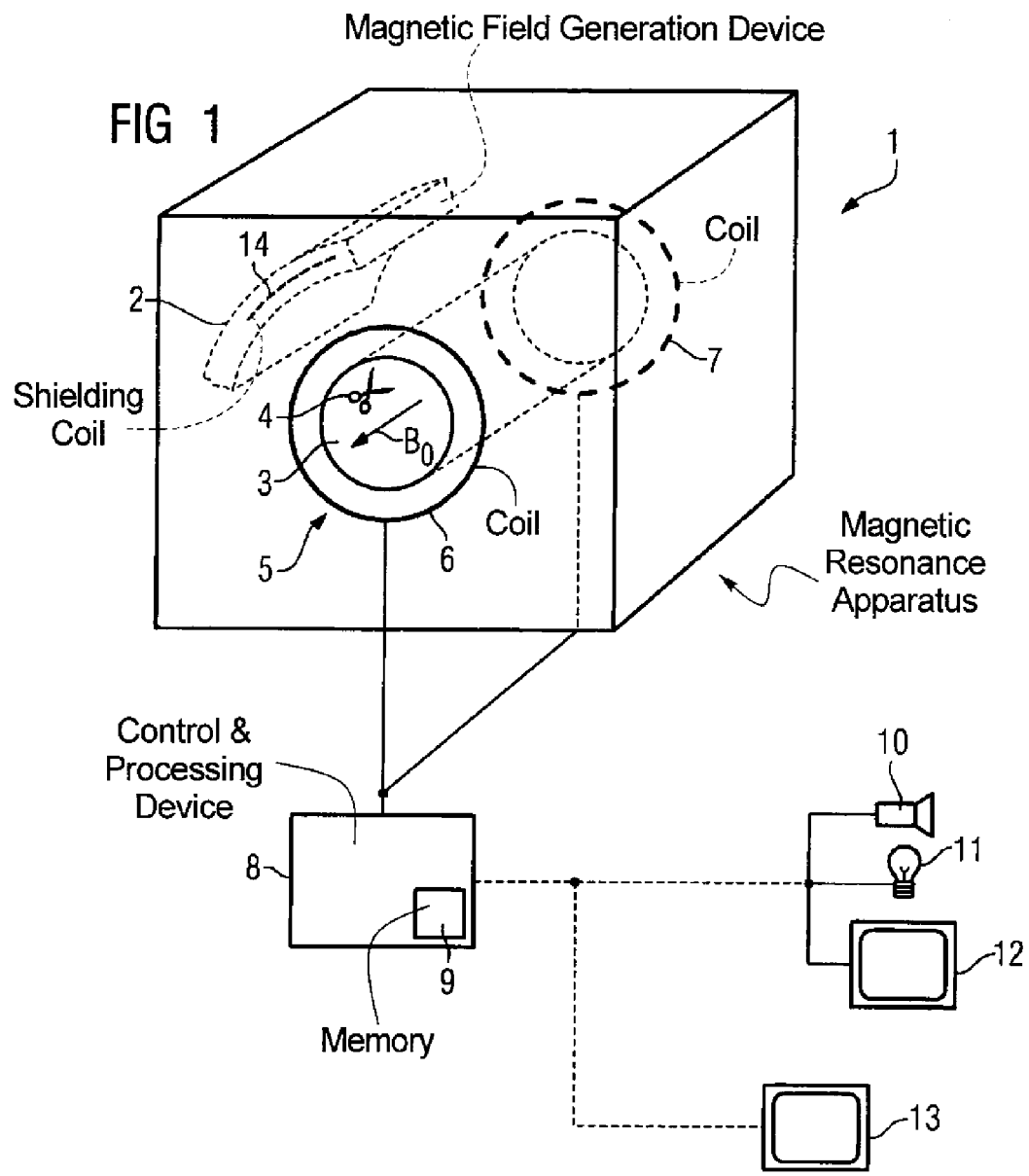
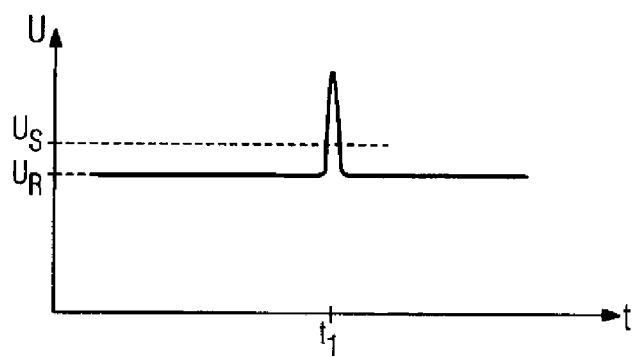

METHOD AND MAGNETIC RESONANCE APPARATUS FOR MONITORING APPARATUS INTERACTION WITH MAGNETICALLY-ATTRACTED OBJECTS

BACKGROUND OF THE INVENTION

1. Field of the Invention

The invention concerns a magnetic resonance apparatus having a magnetic field generation device for generating a magnetic field.

2. Description of the Prior Art

As is generally known, a magnetic resonance apparatus serves for acquisition of slice images of an examination subject using various magnetic fields to which the patient is exposed. A temporally-constant magnetic field (the basic magnetic field) is generated by a magnetic field generation device for polarization of the atomic nuclei in the body to be examined. The magnetic field generation device is typically executed as an axially superconducting magnet. This magnetic field is continuously generated because an alternating activation and deactivation of the superconducting magnet is not operationally possible; it is thus permanently on. Gradient fields directed in three spatial directions for spatial coding are generated by a typically cylindrical gradient coil while an alternating magnetic field for excitation of the atomic nuclei is generated by a radio-frequency or measurement coil. The radio-frequency alternating field that arises from the processing nuclear moment is also detected and is supplied as an image signal to the downstream image processing.

While the gradient and magnetic fields are generated only for examination of the subject, as stated the magnetic field generated by the magnetic field generation device (in the form of the superconducting basic field magnet) is continuously present. This magnetic field exhibits a field strength of multiple T, typically 0.1-3T.

As is generally known, the permanent, temporally constant magnetic field is present not only inside the magnetic resonance apparatus (typically a cylindrical bore) into which the patient is inserted for image acquisition, but also its stray field extends considerably far in regions outside of the magnetic field generation device, or around it. If a ferromagnetic object is located near to the magnetic field generation device in the region of the still-effective magnetic field (stray field), an interaction of the ferromagnetic object with the magnetic field occurs, causing the object to be attracted by the magnetic field and pulled onto or into the magnetic field generation device. Such an object then adheres to the housing of the magnetic field generation device or inside the bore at the respective wall and inevitably influences the generated magnetic field.

Typical magnetic resonance apparatuses are located in sealed cabins in which no loose ferromagnetic objects are present. Nevertheless, it frequently occurs that persons enter this room and bring such objects with them. Such objects can be, for example, scissors, a ball-point pen, a watch, coins etc. (thus arbitrary objects that are frequently carried by persons who work on or with magnetic resonance apparatuses). Although these persons are obligated to deposit such objects outside of the room in order to avoid these objects being attracted to the magnetic resonance apparatus due to interaction, this requirement is frequently not respected. As a result, it is relatively often that an object is attracted by the magnetic field and strikes against the magnetic resonance apparatus. Insofar as the user recognizes this, he or she typically immediately removes the object. Nevertheless, it can occur that such an impact is not detected; the object then adheres on the magnetic resonance apparatus and disadvantageously influences the magnetic field and consequently the image acquisition. Such objects can also cause damage to the magnetic resonance apparatus depending on where the object strikes, and its momentum. The magnetic field is still very strong in the region outside of the magnetic resonance apparatus, such that even small objects strike with large momentum on the magnetic resonance apparatus. Such damage can even lead to an actual destruction of the magnetic resonance apparatus, which then possibly fails and would have to be serviced. The person causing such a failure often cannot be traced by the device operator because, as stated, in such a case a person who has accidentally taken such an object into the room with him or her usually immediately removes the attracted object after the damage has been done.

SUMMARY OF THE INVENTION

An object of the present invention is to provide a magnetic resonance device that provides the possibility for detection of the impact of a magnetically attracted object, particularly small ferromagnetic objects.

This object is achieved in accordance with the invention by a magnetic resonance apparatus of the aforementioned type having at least one detection device that automatically detects an object attracted onto or into the magnetic resonance apparatus due to interaction with the magnetic field thereof.

In the inventive magnetic resonance apparatus, using a special detection device an active monitoring ensues with regard to possible objects impermissibly drawn onto or into the magnetic resonance apparatus due to magnetic interaction, in particular small objects that cannot always be immediately detected, which is different than the case with larger objects such as walker frames of disabled persons or the like that can be detected immediately. By the detection device the possibility is provided to the user or an arbitrary third party of being able to immediately detect such an impact and to be able to react correspondingly. The detection device appropriately communicates with at least one acoustic emitter and/or optical display (warning device) for output of detection information upon detection of such an impermissibly attracted object. Such a warning device can be a horn or a blinking light or a monitor on which appropriate information is output. This warning device can be in proximity to the system; it can also (possibly additionally) be located at a safety officer who is informed about the situation in such a case. In such a case an automatic information supplied to a service location of the system manufacturer via a data connection that immediately relays the detection information, would also be conceivable if appropriate.

The detection device itself inventively has a control and processing device as well as at least one coil. The coil is fed with current via the control and processing device. If a ferromagnetic object attracted by the magnetic field moves relative to the coil (which is preferably provided in a region of the forward and/or rear end of a bore serving for the acceptance of a subject to be examined, advantageously wound around the bore), a voltage or a voltage change is thus induced in the coil that can be immediately detected by the control and processing device. The tapped voltage signal of the coil is constant insofar as no ferromagnetic object is located or moves in its proximity. A voltage change arises only when such an object is moved relative to the coil. From this it can immediately be derived that an object was attracted onto or into the magnetic resonance apparatus. It is naturally possible to associate the detected voltage or voltage change with a threshold above which the detection of an object is first definitively detected in order to avoid possible voltage fluctuations or minimal field changes (as can possibly occur upon positioning of a patient or the like anyway) leading to signal emission.

If the magnetic resonance apparatus is a typical cylindrical apparatus with a central patient bore around which the magnetic field generation device and the further gradient and radio-frequency coils are arranged, the detection coil is preferably located directly next to the bore opening, the detection coil proceeding in a circle. A second coil naturally can be provided at the opposite bore opening at the back wall of the apparatus. If the magnetic resonance apparatus is an "open" apparatus or has a C-magnet, the detection coil can be correspondingly positioned.

It is particularly appropriate for the detection device (in particular the control and processing device) to store the detection and the detection point in time in an associated memory. The fact that a detection has occurred in general as well as the point in time of the detection are thus stored. This offers the possibility in each case to detect when an object struck the system. Insofar as protocol of those who worked at the magnetic resonance apparatus at specific times is followed, the person possibly responsible for this circumstance can ultimately be identified. This information, in particular in connection with the output of corresponding signal information as already described in the introduction, is important for the operator of the magnetic resonance apparatus (as well as, if applicable, for the apparatus manufacturer or the company entrusted with the maintenance). Responsibility for a large damage this can be assigned, such as on the part of the system operator or the user, or it can be determined whether the failure (which, for example, may lead to maintenance) is an error of the apparatus itself.

In an embodiment of the invention the operation of the magnetic resonance apparatus can be blocked by the detection device (in particular the control and processing device) upon detection of an object. This embodiment of the invention, that is advantageous for safety considerations, thus offers the possibility to immediately block the apparatus operation if the impact of a magnetically attractive object was detected since such an impact can lead to a damage to the apparatus such that it either no longer functions correctly or represents a source of danger for people; or a proper image acquisition possibly can no longer be ensured as a consequence of the field interference resulting from the ferromagnetic object possibly adhering inside the examination volume. This blocking can be non-temporary and, for example, may be cancelled again only by a safety officer or administrative personnel, possibly in connection with a release code. The cancellation of the block by an active operation of a user is also conceivable, with the user, for example, being prompted by an apparatus monitor to actively provide a release signal after he or she has examined the system and, if necessary, removed the object.

As stated above, at least one detection coil is appropriately used in cylindrical magnetic resonance apparatuses, preferably arranged directly at the bore entrance and/or exit. However, it would also be conceivable to use an integrated shielding coil as a possible further coil that forms a part of the detection device. Such shielding coils are used for shielding the superconducting magnetic field generation device that generates the temporally-constant magnetic field (basic magnetic field) and serve to shield this magnetic field generation device from external influences that are field-distorting as well as to a shield the external area from the generated magnetic field. It would sometimes also be conceivable to use this coil as a detection coil, possibly in addition to separately-provided detection coils.

In principle the detection device can have a separate control and processing device, even in if a shielding coil already integrated in the apparatus is used as a detection coil. Alternatively, it is conceivable to use the control and processing device serving for the control of the operation of the magnetic resonance apparatus for this purpose.

In addition to the magnetic resonance apparatus itself, the invention also concerns a method for monitoring a magnetic resonance apparatus for detection of an impact of an object attracted onto or into the magnetic field generation device due to interaction with a magnetic field generated by the magnetic field generation device. The detection is made by a detection device having a control and processing device as well as at least one coil arranged on the magnetic resonance apparatus. The coil is fed with current continuously and a voltage or voltage change, induced in the coil given an interaction-dependent movement of an object relative to the coil on or in the magnetic resonance apparatus, is detected as an indication of an impact.

The control and processing device appropriately also detects the point in time of the detection of the induced voltage or voltage change and stores this in a memory together with information about the fundamental detection of an impact, from which memory this information can be read out as needed and displayed on a monitor or the like and, if applicable, further processed or relayed.

The control and processing device appropriately also communicates with at least one acoustic emitter and/or optical display that outputs detection information upon detection of an object. Such an output device can be provided immediately in the examination room where the magnetic resonance apparatus stands, possibly in the control room located immediately next to the examination room, or at a decentralized location at a safety officer or other responsible party of the apparatus manufacturer, or possibly at a service station of the system manufacturer.

Furthermore, the control and processing device can block the operation of the, magnetic resonance apparatus upon detection of an object. This block, for example, can be cancelled again by the safety officer or a service person. The block can possibly ensue dependent on the size of the detected magnetically attracted object, such as a ferromagnetic object. The size can possibly be derived from the magnitude of the induced voltage or voltage change. A very small ferromagnetic object that is pulled into the magnetic resonance apparatus will induce a smaller voltage or voltage change than a larger object. A block can, for example, only ensue upon the induced voltage or voltage change exceeding a certain threshold.

Given a magnetic resonance examination apparatus having a central bore serving for the acceptance of the examination subject, at least one coil proceeding around the bore can be used at the front and rear bore ends. Both coils can be fed with current by the control and processing device and respective induced voltages or voltage changes are detected by the control and processing device independently of one another.

Alternatively or additionally, a shielding coil integrated into the apparatus can be used as a further coil, the shielding coil communicating with the control and processing device, which can either be a separate device or the device controlling the general operation of the magnetic resonance apparatus.

DESCRIPTION OF THE DRAWINGS

FIG. 1 schematically shows the basic components of an embodiment of an inventive magnetic resonance apparatus fashioned for implementation of the inventive method.

FIG. 2 shows voltage-time diagram for explaining the invention.

DESCRIPTION OF THE PREFERRED EMBODIMENTS

FIG. 1 shows an inventive magnetic resonance apparatus 1 having a magnetic field generation device 2 (only partially shown) that is fashioned as a cylindrical superconducting magnet and proceeds around a central bore 3 into which a patient to be examined is inserted. A homogeneous basic magnetic field is generated in a known manner inside the bore 3 in a specific examination volume by this superconducting magnetic field generation device 2. This magnetic field is present with chronological interruption, thus also when no examination is to be made. Furthermore, a gradient coil with typical sub-coils for generation of directed gradient fields for spatial resolution as well as a radio-frequency coil for generation of a radio-frequency alternating magnetic field and for acquisition of the magnetic resonance signals from the examination subject are provided in a known manner, but are not shown in detail. The typical design and operation of a magnetic resonance apparatus is sufficiently known to those skilled in the art and do not need to be explained in detail herein.

The homogeneous magnetic field (indicated as $B_0$ in FIG. 1) generated by the magnetic field generation device 2 acts not only inside the bore 3 but also (due to its stray field components) considerably far outside of the bore 3 in the surroundings of the magnetic resonance apparatus 2. If a loose magnetically attracted object, such as a ferromagnetic object, is located in the active range of the basic magnetic field $B_0$, it inevitably enters into interaction with the magnetic field $B_0$ and is attracted by this. In the shown example, this is an object 4 (here in the form of small scissors) that was attracted due to interaction with the magnetic field $B_0$ and drawn inside the bore and struck the inner bore wall. This can lead to damage; or a correct image acquisition operation may not be possible due to the field-distorting property of the ferromagnetic object 4; or maintenance may need to be conducted, etc.

For detection of the impact of such an object namely the attraction thereof, a detection device 5 is provided formed (in the shown exemplary embodiment) by two coils 6, 7, of which the coil 6 is, for example, arranged in the region of the front opening of the bore 3 and the coil 7 is arranged in the region of the rear opening of the bore 3. Each coil 6, 7 proceeds as an annular coil around the bore opening. Each coil 6, 7 communicates with a control device 8 which can possibly be the central control device controlling the operation of the magnetic resonance apparatus 1, thus also that of the magnetic field generation device 2 as well as the further coils, etc. The control and processing device 8 also has a memory 9 and is connected with various warning devices via a conductor connection. Shown is an acoustic emitter 10 (for example in the form of a horn) an optical display means 11 (for example in the form of a blinking light) as well as a further optical display means 12 in the form of a monitor, on which monitor appropriate information can be output if the impact of an object was detected. In the shown example the memory 9 is also connected (for example via an internet or telephone line etc.) with an optical display 13 (for example in the form of a monitor) that is located, for example, arranged at an external service station of the apparatus manufacturer. There thus exists the possibility to directly inform this service station about such an impact. The display devices 10, 11 and 12 can be located at any site (for example in the hospital or the like) in which the magnetic resonance apparatus is situated, for example directly in the region of the magnetic resonance apparatus or at a safety officer etc., for example.

For detection of a possible impact of an object 4, each of the coils 6, 7 is fed with current via the control device 8 such that they respectively generate an albeit relatively weak magnetic field. If, for example, an object 4 is drawn into the bore 3 from outside due to the interaction with the magnetic field $B_0$, it moves here with high speed perhaps flying through the intervening space, for example through the annular coil 6. In particular because a loose object is attracted with large force and strikes with a large momentum, this leads to a momentary induction of a voltage or voltage change in the coil 6 that can be detected by the control and processing device 8. This fact is shown as an example in FIG. 2, where the voltage U that can be tapped at the coil 6 is plotted along the ordinate and the time is plotted along the abscissa. Shown is the rest voltage $U_R$, which is constant and typically does not fluctuate or fluctuates minimally. Also shown is a threshold voltage $U_S$ that must be exceeded by a voltage or voltage change induced by a moving object so that this voltage or voltage change can be detected as an impact event. In the shown example, the object 4 moves into the bore 3 at the point in time $t_1$, apparently yielding a sharp voltage peak that can be detected by the control and processing device 8 and is evaluated as a measure for an impact. This event is stored in the memory 9 together with the detection point in time $t_1$ and can be retrieved at any time. Depending on the embodiment of the detection device 5, at the same time an alarm signal can be output via one or more of the display devices 10, 11, 12 and/or 13. The possibility simultaneously exists to at least temporarily block the operation of the magnetic resonance apparatus via the control device 8, possibly also dependent on the size of the impacted object, which can be derived from the magnitude of the induced voltage or voltage change.

In FIG. 1 a shielding coil 14 is additionally shown in section as part of the magnetic field generation device 2. This shielding coil 14 serves for generation of shielding fields. As needed, it would also be conceivable to use this shielding coil 14 as a detection coil and to evaluate possible induced voltages or voltage changes detected by it in the manner described above.

Although modifications and changes may be suggested by those skilled in the art, it is the intention of the inventor to embody within the patent warranted hereon all changes and modifications as reasonably and properly come within the scope of his contribution to the art.

I claim as my invention:

1. A magnetic resonance apparatus comprising:
    a magnetic field generator that generates a magnetic field, said magnetic generator having a plurality of components associated therewith;
    a detector physically associated with said magnetic field generator that automatically detects an object that is magnetically attracted onto or into at least one of said components by interaction with said magnetic field;
    said detector comprising at least one coil that emits an electrical output signal upon interaction with said object, and a processing device that processes said electrical output signal to identify an occurrence of said interaction; and
    said magnetic field generator comprising a bore proceeding therethrough having first and second openings at opposite sides of said magnetic field generator, and said at least one coil proceeding around said bore in at least one of said first and second sides of said magnetic field generator.

2. A magnetic resonance apparatus as claimed in claim 1 wherein said processing device comprises a memory in which said occurrence and a point-in-time of said occurrence are stored.

3. A magnetic resonance apparatus as claimed in claim 1 comprising a warning device connected to said processing device that emits a humanly perceptible signal upon detection of said occurrence.

4. A magnetic resonance apparatus as claimed in claim 1 wherein said components include at least one operational component used for operation of said magnetic resonance apparatus, and wherein said processing device blocks operation of said at least one operation component upon detection of said occurrence.

5. A magnetic resonance apparatus as claimed in claim 1 wherein said magnetic field generator comprises a shielding coil integrated therein, and wherein said detector device comprises said shielding coil, said shielding coil emitting an electrical output signal upon an occurrence of said interaction.

6. A method for monitoring a magnetic resonance apparatus comprising the steps of:
generating a magnetic field using a magnetic generator having a plurality of components associated therewith said magnetic field generator comprises a bore proceeding therethrough having first and second openings at opposite sides of said magnetic field generator;
with a detector physically associated with said magnetic field generator, automatically detecting an object that is magnetically attracted onto or into at least one of said components by interaction with said magnetic field and from said detector, emitting a detector output signal indicating that said object is attracted onto or into at least one of said components; and
said detector, at least one coil that emits an electrical coil output signal upon interaction with said object, and comprising using said electrical coil output signal as said detector or output signal, and at least one coil proceeding around said bore in at least one of said first and second sides of said magnetic field generator.

7. A method as claimed in claim 6 comprising storing said occurrence and a point-in-time of said occurrence in a memory.

8. A method as claimed in claim 6 comprising automatically emitting, as said detector output signal, a humanly perceptible signal upon detection of said occurrence.

9. A method as claimed in claim 6 wherein said components include at least one operational component used for operation of said magnetic resonance apparatus, and comprising, in response to emission of said detector output signal, automatically electronically blocking operation of said at least one operation component upon detection of said occurrence.

10. A method as claimed in claim 6 wherein said magnetic field generator comprises a shielding coil integrated therein, and comprising using said shielding coil as said detector, said shielding coil emitting an electrical shielding coil output signal as said detector output signal upon an occurrence of said interaction.

* * * * *